United States Patent [19]

Roberts

[11] 3,796,881

[45] Mar. 12, 1974

[54] ENCAPSULATED LIGHT ACTIVATED SEMICONDUCTOR DEVICE

[75] Inventor: John S. Roberts, Export, Pa.

[73] Assignee: Westinghouse Electric Corporation, Pittsburgh, Pa.

[22] Filed: Apr. 28, 1972

[21] Appl. No.: 248,453

[52] U.S. Cl.... 250/211 J, 317/235 N, 317/235 AB, 317/235 R, 317/234 H, 307/305

[51] Int. Cl. ............................................ H01l 11/10

[58] Field of Search .. 317/235 N, 235 AA, 235 AB; 307/248, 305; 250/211 J

[56] References Cited

UNITED STATES PATENTS

| | | | |
|---|---|---|---|
| 3,590,344 | 6/1971 | Roberts et al. | 317/235 N |
| 3,585,454 | 6/1971 | Roberts | 250/211 J |
| 2,999,940 | 12/1961 | Hoffman et al. | 250/211 J |
| 3,697,833 | 10/1972 | Nakata | 317/235 AB |

*Primary Examiner*—Maynard R. Wilbur
*Assistant Examiner*—H. A. Birmiel
*Attorney, Agent, or Firm*—C. L. Menzemer

[57] ABSTRACT

This disclosure is concerned with a four region light activated controlled rectifier encapsulated in a flat package case thereby readily lending to stacking of the device. The controlled rectifier, which comprises in part a body of semiconductor material, preferably silicon, having two opposed and substantially parallel major surfaces has four alternate regions of opposite type conductivity, the two end regions being emitter regions and the two middle regions being base regions, is "turned-on" by light. The light enters the encapsulated package at an angle to the perpendicular, called the "angle of incidence" and strikes one major surface of the body of semiconductor material, passes entirely through the body to the opposed major surface and is reflected back through the body.

7 Claims, 8 Drawing Figures

ENCAPSULATED LIGHT ACTIVATED SEMICONDUCTOR DEVICE

GOVERNMENT CONTRACT

This invention was made in the course of work performed under U.S. Government Contract NOOO39-71-C-0228 with the U.S. Navy.

DESCRIPTION OF THE PRIOR ART

The present design of light activated semiconductor devices, and in particular light activated switches or controlled rectifiers involves a compromise between effective heat sinking, sufficient electrical contact area, and sufficient optical contact area.

In the absence of an electrical contacting material which would be transparent to the activating radiation or light, the surface of the body of semiconductor material, for example silicon, through which the activating light enters cannot be electrically contacted. Consequently, the light can only enter the body of silicon over a relatively small area and lateral current flow must take place before the entire body is "turned-on."

A typical prior art device 8 is shown in FIG. 1. The light activated device 8 of FIG. 1 is a four region switch and is comprised of a body of silicon 10 having a P-type anode emitter region 12, an N-type base region 14, a P-type base region 16 and an N-type cathode emitter region 18. The device 8 includes two power terminals 28 and 33 adapted for connection to a source of electrical power, not shown. In the particular embodiment shown the lower terminal 28, preferably formed from copper or some other similar material of high electrical conductivity has a flat portion 30 on which the lower anode emitter region 12 is bonded. Extending downwardly from the flat portion 30 is a threaded stud portion 32 adapted for connection to a heat sink or the like.

The upper terminal 33 comprises an elongated column, also of copper or some other material of high electrical conductivity, and has a lower flattened portion 34 which rests on the upper surface of the body 10 and is bonded to the cathode emitter region 18. Surrounding the body 10 and hermetically sealed to the terminals 28 and 33 is a cup-shaped ceramic insulator 36.

The assembly described thus far is similar in construction to a conventional four-region switch, except that the gate lead found in pulse gated devices is eliminated. Instead of a conventional gate lead, this type of device has an internal bore member disposed in the upper power terminal 33; and the upper end of the bore 38 is connected through a light pipe 40, preferably butted against the surface of the cathode emitter, to a source of light energy, typically a gallium arsenide laser diode, or laser diode stack 42. The light generated by the laser diode 42 is conducted through the light pipe 40 directly onto an unmetallized area on the upper surface of the cathode emitter region 18. The device is thus optically triggered by having the light, schematically illustrated by the arrows 44, pass through the cathode emitter region 18 and into the P-type base region 16 and to some extent; into the N-type base region 14.

Prior art light activated switches have almost exclusively been stud-mounted devices of the type shown in FIG. 1 and as such cannot be closely stacked to handle high voltages.

Attempts to build light activated flat pack devices and to stack them for high voltage capabilities has not been entirely commercially successful as too much spacing between devices is required to get the light into the device.

FIG. 2 shows a typical prior art stack of light activated devices.

The stack 50 is comprised of a plurality of flat packaged-light activated-four region switching devices 52 with an electrically conductive spacer member 54 disposed between each device 52. A light pipe 56 extends through each of the spacers 54 and into the top of the encapsulated device 52. Light transmitted through the pipes 56 turn-on the devices 52.

The devices 52 are the same type as shown in FIG. 1 except that it is encapsulated in a flat package instead of a stud-mounted package as shown in FIG. 1.

The stack 50 of FIG. 2 has a major shortcoming. To accommodate the light pipe the spacer 54 must be relatively thick. The added thickness increases circuit inductance and space requirements.

In radar modulator circuits where *di/dt* may be several thousand amps per microsecond, extremely small inductances can be very important, for example at 2000 amperes per microsecond a $5 \times {}^{-8} h$ inductance will have a voltage drop of 100 volts across the inductance. A single spacer can easily provide such an inductance.

SUMMARY OF THE INVENTION

In accordance with the present invention there is provided a semiconductor device comprising a body of semiconductor material encapsulated in a case member, said body having four regions of alternate type conductivity, a p-n junction between each adjacent region, said body having two major opposed, substantially parallel flat faces, means for directing light energy onto a portion of one of said flat surfaces, said means including an aperture formed by walls of said case member, said aperture extending entirely through said case member at an angle off the perpendicular, whereby said light energy strikes one of said flat surfaces of the body at a predetermined angle.

DESCRIPTION OF DRAWINGS

For a better understanding of the nature of the invention reference should be had to the following detailed description and drawings, in which.

DESCRIPTION OF THE PREFERRED EMBODIMENT

Figure 3:
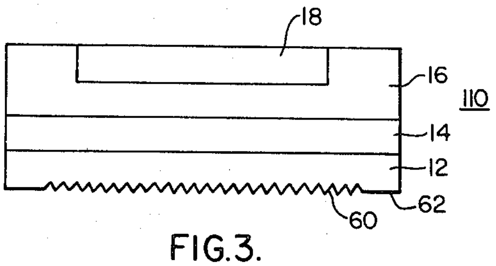
FIGS. 3, 4 and 5, are side views of bodies of semiconductor material suitable for use in the device of this invention.

With reference to FIG. 3, there is shown a body of semiconductor material 110 suitable for use in the light activated device of this invention.

Figure 1:
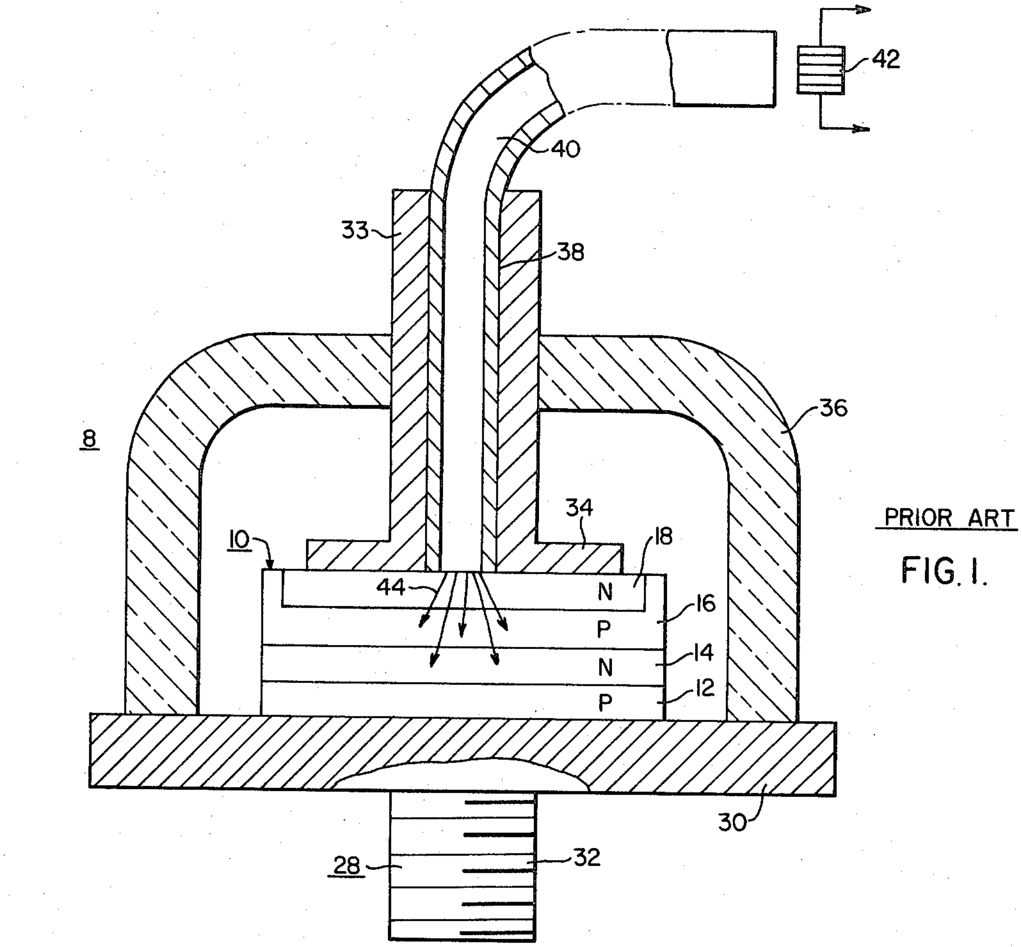
PRIOR ART FIG. 1.
FIG. 1 is a side view of a typical prior art light activated device.
Figure 2:
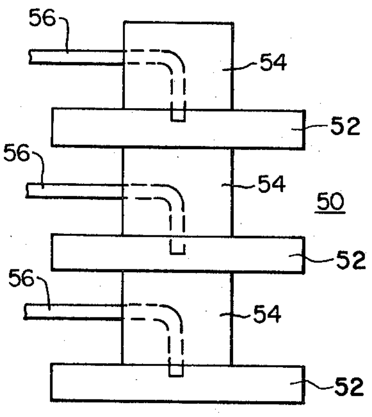
FIG. 2 is a schematic view of a stack of prior art light activated devices.

The body 110 of semiconductor material shown in FIG. 3 resembles the body of semiconductor material 10 shown in FIG. 1 and all like features have the same designation as those used in FIG. 1.

The body 110 of FIG. 3 has one feature not found in prior art devices. That feature is reflective means 60. The reflective means 60 is a series of grooves formed in bottom surface 62 of body 110. The reflection means 60 in conjunction with light radiation which penetrates deep inside the semiconductor material provides more rapid "turn-on" of the device. The radiation strikes the reflective means, grooves 60, and is reflected immediately throughout the body 110. The relatively remote area of the body is thus activated without any delay for lateral speeding to take place.

The use of such reflective means is fully discussed in U.S. application Ser. No. 834,997, filed June 20, 1969 the assignee of which is the same as that of the present application.

Figure 4:
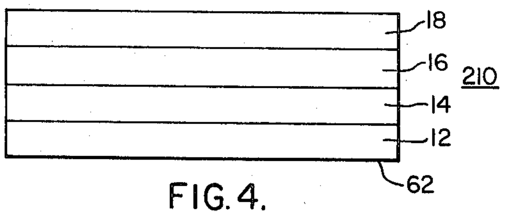

While the incorporation of such reflective means, such as grooves 60 of FIG. 3 is desirable, they are not necessary and the bottom surface 62 of the device 10 may be smooth and without such grooves. Such a body is shown in FIG. 4 and denoted as body 210.

In addition, it is not necessary for region 16 to be exposed at the top surface of the body. This modification is also shown in FIG. 4.

Figure 5:
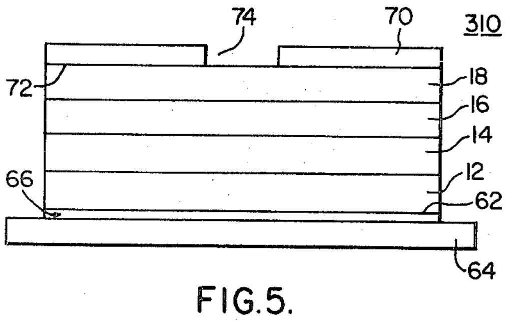

With reference to FIG. 5, an electrical metal contact 64, of for example, molybdenum, tungsten or tantalum or base alloys thereof is soldered to bottom surface 62 of body 10 by a solder layer 66. The solder layer 66 is preferably a hard solder, that is a gold or silver alloy melting above about 350°C.

A second electrical contact 70 is affixed to top surface 72 of the body 10. Preferably, contact 70 is an evaporated aluminum layer having a thickness of from 55,000 to 65,000 A. The body with electrical contacts shown in FIG. 5 is denoted as 310.

It should be noted that there is an aperture or window 74 extending through the contact 70 to allow the light energy to strike surface 72 of the body.

The area of window 74 depends upon the *di/dt* requirement of the finished device. The window area to *di/dt* capability should be such that current density does not exceed 5,000 amperes per square centimeter in the device. An aperture having a diameter of 150 mils allows a *di/dt* of 4,000 amperes per microsecond.

If a semiconductor body having the configuration shown in FIG. 3, relative to regions 18 and 16 is used, the contact 70 is disposed only on that portion of surface 72 where region 18 is exposed and does not overlap onto region 16.

Figure 6:
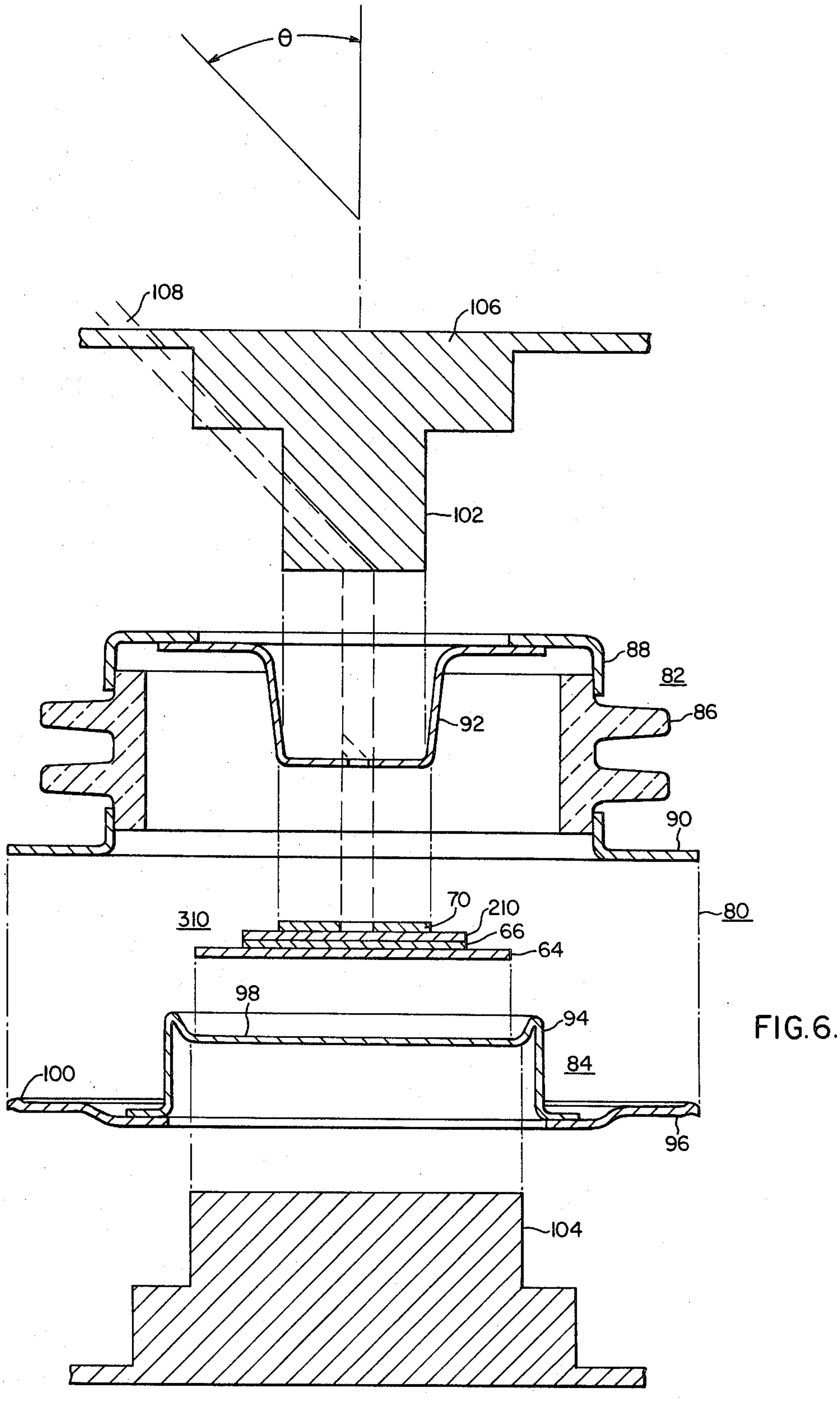
FIG. 6 is an exploded view of a light activated semiconductor made in accordance with the teachings of this invention.

With reference to FIG. 6, the body 310 of FIG. 5 is shown housed within a compression bonding encapsulating case. FIG. 6 is shown in an exploded view for purposes of clarity.

It should be understood that body 310 can be the body of semiconductor material shown in either FIGS. 3 or 4.

Referring to FIG. 6, the body 310 is disposed within an encapsulation 80, which includes upper and lower portions 82 and 84, respectively. In the actual commercial manufacture of this assembly, the body 310, the upper portion 82 of encapsulation 80, and lower portion 84 of encapsulation 82 may all be preassembled, as shown, with the final assembly merely involving the joining together of the upper and lower portions, 82 and 84 respectively, of encapsulation 80, with the body 310 disposed therein.

More specifically, upper portion 82 of encapsulation 80 may include electrical insulating means 86 formed of zircon porcelain, or other suitable insulating material, and metallic flanged members 88 and 90, which are selected to have a coefficient of thermal expansion which substantially matches that of insulating means 86, and which may be joined to insulating means 86 by brazing, soldering, or other joining means. For example, members 88 and 90 may be formed of a copper plated alloy containing 10 to 35 percent, by weight, cobalt, 22 to 33 percent, by weight, nickel, and the balance being iron with incidental impurities, such alloy being well known by the trade name of Kovar. Metallic members 88 and 90 may be joined to insulating means 86 by a silver solder, or other suitable brazing material. The portion 82 of encapsulation 80 is completed by brazing a cup-like member 92 to member 88 with cup-like member 92 being formed of a relatively soft metal having a high thermal and electrical conductivity, such as silver. Cup-like member 92 will form one of the pressure contacts to body 310, and the bottom diameter of cup-like member 92 may be substantially the same as the diameter as the aluminum layer 70.

The bottom portion 84 of encapsulation 80 includes metallic cup-like member 94 which, like member 92, also forms one of the pressure contacts to body 310, and metallic member 96. Cup-like member 94 may also be formed of silver. Cup-like member 94 is joined to metallic member 96 by silver solder, or other suitable joining means. Cup member 94 may have a depressed portion 98 on the external portion of the bottom of the cup which has a diameter which will receive an aligned contact 64 of body 310. Metallic member 96 is formed of a material which may be readily joined to member 90 of portion 82. For example, member 96 may be formed of copper plated steel, and projection welded to member 90, with raised portion 100 of member 96 being a welding embossment.

The final assembly of the completed encapsulated device merely involves placing body 310 in the depression 98 of lower portion 84, with contact 64 of body 310 being disposed to contact the depression 98. The upper portion 82 of encapsulation 80 is then placed over cup-member 94 of lower portion 84, with members 90 and 96 being in contact. Members 90 and 96 are joined, such as by welding to complete the assembly.

A suitable dessicant may be disposed within the encapsulation 80, if desired. Thus, encapsulation 80, has two oppositely disposed cup-like members which create relatively large, oppositely disposed, external depression in encapsulation 80.

The contacting cup-like member 92 and 94 which provide the pressure contacts to body 310 have the open portion of the cups facing outwardly, and the bottom portion of the cups extending inwardly to contact the contacts 70 and 64 of body 310. This allows relatively large electrode members 102 and 104 to extend into the openings provided by cup members 92 and 94 and provide the required pressure to produce high quality compression bonded joints between body 310, cups 92 and 94, the electrodes 102 and 104. Electrode members 102 and 104 may be formed of copper, or other suitable material having good electrical and thermal characteristics.

Light energy to "turn-on" the device is introduced through a light pipe, not shown, disposed in an aperture 108 which extends entirely through electrode 102 and member 92.

The aperture 108 is at an angle Theta ($\theta$) off the perpendicular (see FIG. 6).

The angle $\theta$ is dependent upon two parameters, (1) the ability to stack the devices without the use of spacers and (2) maximum utilization of the light energy.

The ability to stack can be realized by forming the aperture at an angle $\theta$ of about 20°.

Figure 7:
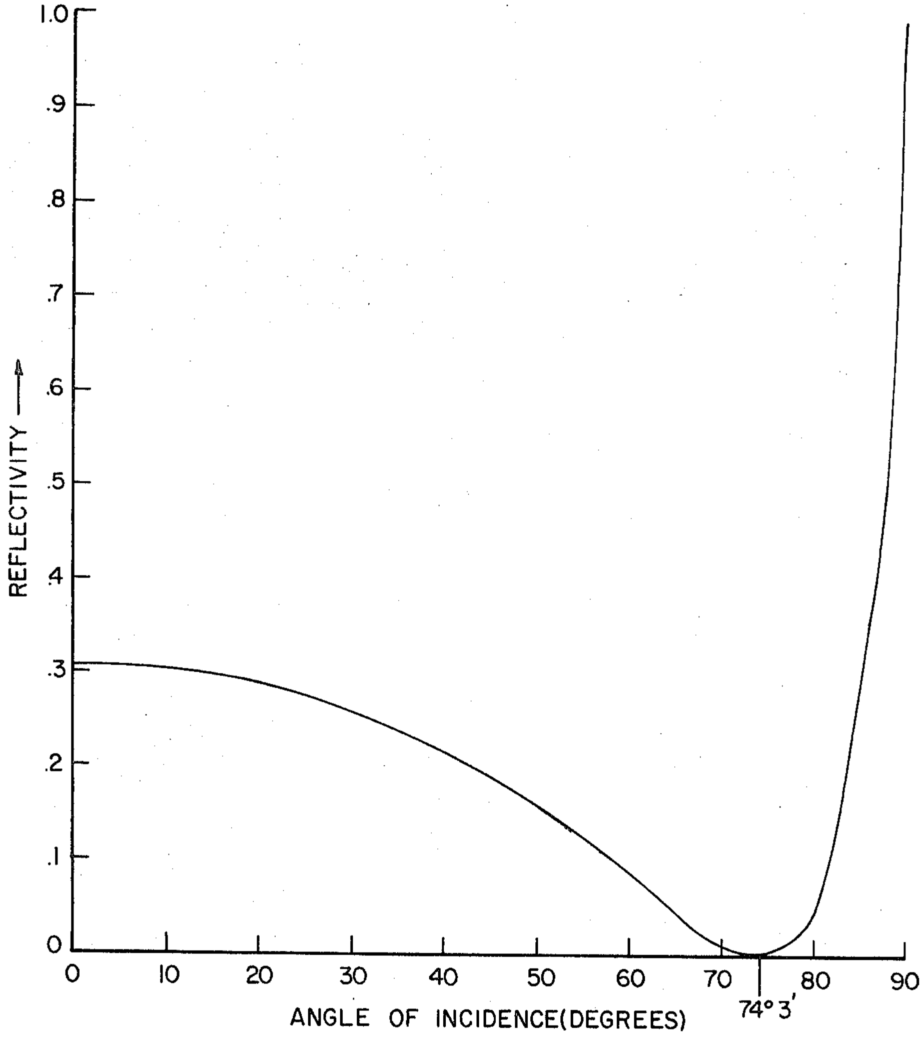
FIG. 7 is a plot of reflectivity v. angle of incidence.

The second parameter, the maximizing of the light energy can be best understood with reference to FIG. 7. FIG. 7 is a plot of reflectivity versus angle of incidence. The data of FIG. 7 is based on reflectivity of air to silicon boundary as a function of angle of incidence for 1.6$\mu$ wavelength light polarized in plane of incidence. The general nature of the curve is essentially accurate for other semi-conductor materials and for other wavelengths of light.

It can be seen from FIG. 7 that an angle $\theta$ of 10° gives a reflectivity of approximately 0.31 or approximately 31 percent of the light energy striking the surface of the silicon wafer is lost through reflection. If $\theta$ is 20° the loss due to reflection is approximately 29 percent. As is apparent from the plot of FIG. 7 as the angle $\theta$ is increased less light energy is lost through reflection. At approximately 74° 3 minutes there is no loss of light due to reflection. The loss due to reflection then begins to increase again as $\theta$ exceeds 74° 3 minutes until when $\theta$ is approximately 85°, loss due to reflection is again about 29 percent. Accordingly, a $\theta$ of from about 20° to 85° is acceptable while a $\theta$ of from about 45° to about 82° is preferred.

Figure 8:
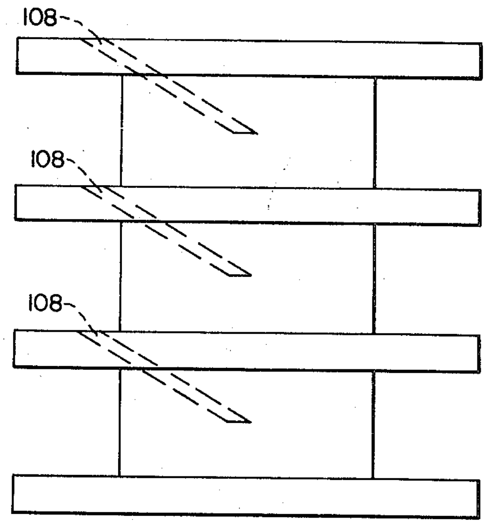
FIG. 8 is a schematic drawing of a stack of devices made in accordance with the teachings of this invention.

With reference to FIG. 8, there is shown schematically three of the devices of FIG. 6 in a stacked configuration. The apertures 108 are at a $\theta$ of approximately 62° and would have a reflection loss of less than 10 percent. The stack of FIG. 8 would not introduce any appreciable inductance into the associated circuit since it does not require the use of any spacers.

I claim as my invention:

1. A semiconductor device comprising a body of semiconductor material encapsulated in a case member, said body having four regions of alternate type conductivity, a p-n junction between each adjacent region, said body having two major, opposed, substantially parallel, flat faces, means for directing light energy onto a portion of one of said flat surfaces, said means including an aperture formed by walls of said case member, said aperture extending entirely through said case member at an angle off the vertical axis of the device perpendicular to said flat faces, whereby said light energy strikes one of said flat surfaces of the body at a predetermined angle.

2. The device of claim 1 in which the walls of the case form the aperture in top surface of the case and the angle of the aperture off the said axis of the device ranges from 20° to 85°.

3. The device of claim 1 in which the walls of the case form the aperture in the top surface of the case and the angle of the aperture off the said axis of the device ranges from 45° to 82°.

4. A semiconductor device comprising a body of semiconductor material having top and bottom opposed major surfaces, said body having four regions of alternate type conductivity disposed alternately between said top surface and said bottom surface, a p-n junction between adjacent regions, an electrical metal contact disposed about the peripheral portion of one of the major surfaces and covering less than the total area of the surface, a second metal electrical contact disposed on the other major surface of the body, and means for directing light energy onto the uncovered portion of said one surface, said light energy striking said uncovered portion of said surface at an angle ranging from about 20° to about 85° off the axis perpendicular to the surface.

5. The device of claim 4 in which the light energy strikes the uncovered portion of the surface at an angle ranging from about 45° to 82°.

6. The device of claim 4 in which there is at least one groove in the said other surface of the body, said groove being disposed below that portion of said one surface not covered by the metal electrical contact.

7. A vertical stack of electrically connected semiconductor devices comprising a plurality of semiconductor devices, each of said devices comprising a body of semiconductor material and an encapsulating case member surrounding and enclosing said body of semiconductor material, said body of semiconductor material having four regions of alternate type conductivity, a p-n junction between each adjacent region, said body having two major, opposed substantially parallel flat faces, said case member having top and bottom major opposed surfaces, one of said surfaces being in an electrical contact relationship with each of said major faces of said body, the top surface of the case encapsulating one body being in an electrical contact relationship with the bottom surface of the case encapsulating another body, and the walls of each top surface of each case forming an aperture entirely through said surface of said case member, said aperture passing through said surface at an angle off the axis perpendicular to the device.

* * * * *